United States Patent
Truong et al.

(10) Patent No.: US 6,603,665 B1
(45) Date of Patent: Aug. 5, 2003

(54) HEAT DISSIPATING ASSEMBLY WITH THERMAL PLATES

(75) Inventors: Phu Truong, Stanton, CA (US); Rong-Che Chen, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/242,225

(22) Filed: Sep. 12, 2002

(51) Int. Cl.$^7$ ................................................ H05K 7/20
(52) U.S. Cl. ...................... 361/752; 361/704; 361/711; 361/718; 361/719
(58) Field of Search ................................ 361/752, 704, 361/711, 718, 719, 720, 707

(56) References Cited

U.S. PATENT DOCUMENTS

| | | | | |
|---|---|---|---|---|
| 5,990,549 A | * | 11/1999 | Chiu et al. | 257/706 |
| 6,014,315 A | * | 1/2000 | McCullough et al. | 361/704 |
| 6,203,191 B1 | * | 3/2001 | Mongan | 374/43 |
| 6,337,228 B1 | * | 1/2002 | Juskey et al. | 438/122 |
| 6,477,058 B1 | * | 11/2002 | Luebs et al. | 361/784 |

* cited by examiner

Primary Examiner—David Martin
Assistant Examiner—Dameon E. Levi
(74) Attorney, Agent, or Firm—Wei Te Chung

(57) ABSTRACT

A heat dissipating assembly for electronic components mounted on a circuit board includes a first thermal plate (10), a second thermal plate (30), and a copper adjusting screw (60). The first thermal plate forms a plurality of offset portions (12) and thereby defines a plurality of recesses at the offset portions respectively. Depths of the recesses correspond to heights of the electronic components. The first and second thermal plates are secured to opposite sides of the circuit board. The first and second thermal plates respectively define first and third holes (14, 32) movably receiving the adjusting screw therein. The adjusting screw is tightened so that it improves thermal contact between the offset portions and the electronic components. Because the adjusting screw is made of highly heat conductive material, heat in the first thermal plate is conducted to the second thermal plate through the adjusting screw.

12 Claims, 2 Drawing Sheets

HEAT DISSIPATING ASSEMBLY WITH THERMAL PLATES

BACKGROUND OF THE INVENTION

1. Field of the Invention

The present invention relates to a heat dissipating assembly for electronic components mounted on computer circuit boards, and particularly to a heat dissipating assembly having thermal plates.

2. Description of the Related Art

A computer circuit board typically has one or more heat-generating electronic devices fixed thereon. The circuit board is often installed in a cramped location inside a computer enclosure. In this environment, there is not enough space to install a conventional bulky heat sink onto any electronic device. Instead, a thermal plate can be attached onto a surface of the electronic device. The low profile of the thermal plate allows it to be accommodated in the limited space inside the computer enclosure.

When there is more than one heat-generating electronic device, a single thermal plate attached to all the electronic devices is most convenient. The electronic devices generally have varying heights. Therefore a configuration of the thermal plate must be tailored to the electronic devices of a particular application, in order to ensure that the thermal plate fits all the electronic devices well. This requires unduly high precision machining, and is time consuming and costly. In addition, a single thermal plate may not provide sufficient heat dissipation in certain applications; for example when the electronic devices generate copious amounts of heat, or when the overall configuration of the circuit board limits the coverage of the thermal plate. A second thermal plate may be attached to an opposite side of the circuit board, but establishing thermal connection between the electronic devices and the second thermal plate is problematic.

BRIEF SUMMARY OF THE INVENTION

Accordingly, an object of the present invention is to provide a heat dissipating assembly requiring relatively low precision machining.

To achieve the above object, a heat dissipating assembly in accordance with a preferred embodiment of the present invention for electronic components mounted on a circuit board comprises a first thermal plate, a second thermal plate, a copper adjusting screw and four fastening screws. The first thermal plate forms a plurality of offset portions and thereby defines a plurality of recesses at the offset portions respectively. Depths of the recesses correspond to heights of the electronic components. The first thermal plate and the second thermal plate respectively define four second holes and four fourth holes in respective corners thereof. The fastening screws are extended through the second and fourth holes, thereby securing the first and second thermal plates to opposite sides of the circuit board respectively. The first thermal plate and the second thermal plate respectively define a first hole and a third hole movably receiving the adjusting screw therein. The adjusting screw is tightened so that it improves thermal contact between the offset portions and the electronic components. Because the adjusting screw is made of highly heat conductive material, heat in the first thermal plate is conducted to the second thermal plate through the adjusting screw.

Other objects, advantages and novel features of the present invention will be drawn from the following detailed description of a preferred embodiment of the present invention with the attached drawings, in which:

DETAILED DESCRIPTION OF THE INVENTION

Figure 1:
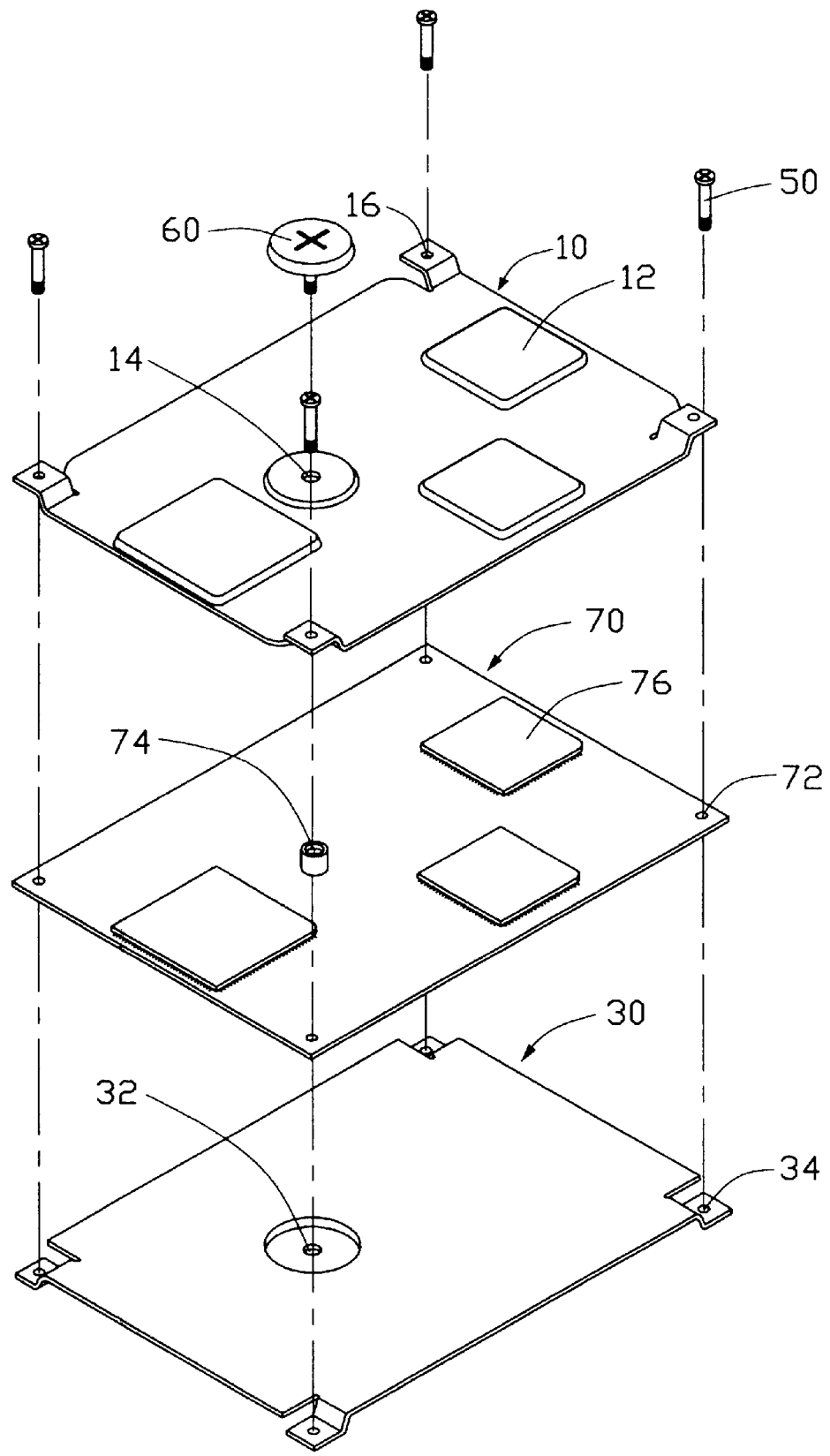
FIG. 1 is an exploded isometric view of a heat dissipating assembly in accordance with a preferred embodiment of the present invention, together with a printed circuit board (PCB)

Referring to FIG. 1, a heat dissipating assembly in accordance with a preferred embodiment of the present invention comprises a first thermal plate 10, a second thermal plate 30, a copper adjusting screw 60 and four fastening screws 50. The first and second thermal plates 10, 30 are for attachment to a printed circuit board (PCB) 70, to dissipate heat from heat-generating electronic components such as chipsets 76 that are mounted on the PCB 70.

The first plate 10 is punched upwardly to form a plurality of offset portions 12 and thereby define a plurality of recesses (not labeled) at the offset portions respectively. Depths of the recesses correspond to heights of the chipsets 76. A first hole 14 is defined in a central portion of the first plate 10. Four second holes 16 are respectively defined in four corners of the first plate 10.

The second plate 30 is generally flat. A third hole 32 is defined in a central portion of the second plate 30. Four fourth holes 34 are respectively defined in four corners of the second plate 30. The third hole 32 and the fourth holes 34 of the second plate 30 respectively correspond to the first hole 14 and the second holes 16 of the first plate 10.

A fifth hole 74 is defined in a central portion of the PCB 70. Four sixth holes 72 are respectively defined in four corners of the PCB 70.

Figure 2:
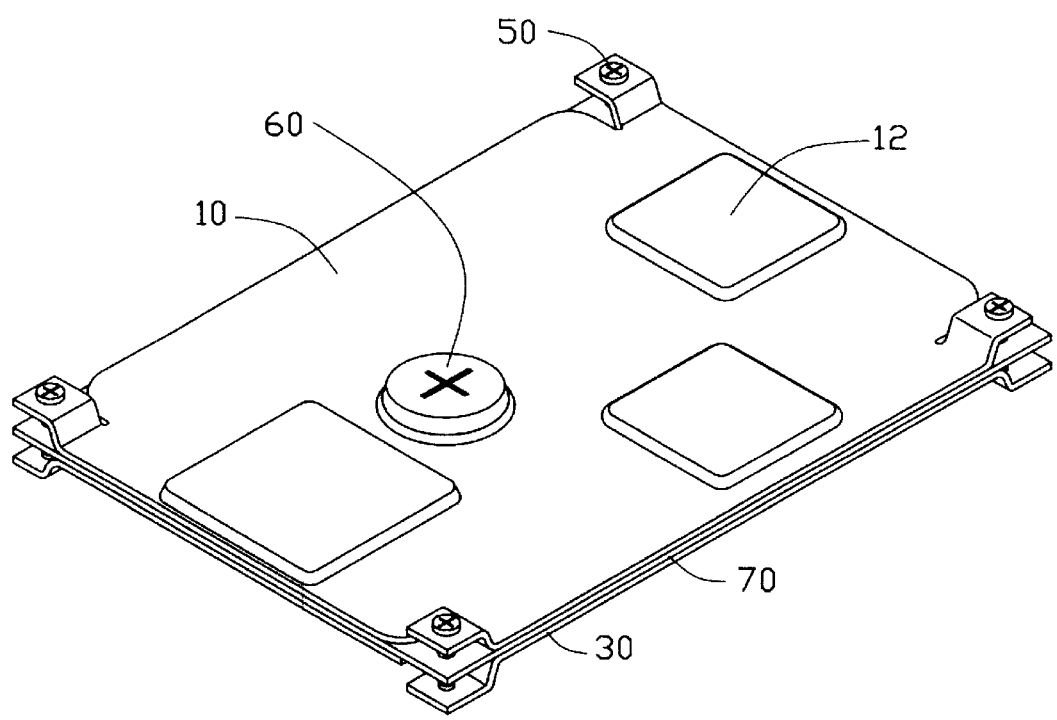
FIG. 2 is an assembled view of FIG. 1.

Referring to FIG. 2, in assembly, the first plate 10 is placed on the PCB 70 over the chipsets 76. The second plate 30 is placed under the PCB 70. The four fastening screws 50 are sequentially inserted through the second holes 16 of the first plate 10, the sixth holes 72 of the PCB 70 and the fourth holes 34 of the second plate 30 to securely fasten the first and second plates 10, 30 to the PCB 70.

Then the adjusting screw 60 is sequentially inserted through the first hole 14 of the first plate 10, the fifth hole 74 of the PCB 70 and the third hole 32 of the second plate 30. The adjusting screw 60 is tightened so that it improves thermal contact between the first plate 10 at the recesses 12 and the chipsets 76 on the PCB 70.

Heat is conducted from the chipsets 76 to the first plate 10, and dissipated from the first plate 10. Because the adjusting screw 60 is made of highly heat conductive material, heat in the first plate 10 is also conducted to the second plate 30 through the adjusting screw 60. Such heat is then dissipated from the second plate 30.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat dissipating assembly for dissipating heat from at least one electronic component of a circuit board, the heat dissipating assembly comprising:

a first thermal plate adapted for being attached to the circuit board to dissipate heat from the at least one electronic component, the first thermal plate having at least one offset portion adapted for receiving the at least one electronic component therein, and defining a first hole in a central portion thereof spaced from the at least one offset portion and a plurality of second holes in corners thereof;

an adjusting screw movably received in the first hole for adjusting thermal contact between the at least one electronic component and the first thermal plate at the at least one offset portion; and a plurality of fastening screws received in the second holes for securing the thermal plate to the circuit board.

2. The heat dissipating assembly as claimed in claim 1, further comprising a second thermal plate defining a third hole corresponding to the first hole of the first thermal plate, and a plurality of fourth holes corresponding to the second holes of the first thermal plate.

3. The heat dissipating assembly claimed in claim 1, wherein the adjusting screw is made of highly heat conductive material.

4. The heat dissipating assembly claimed in claim 1, wherein the at least one offset portion is upwardly punched.

5. In combination, a circuit board with at least one electronic component mounted thereon, and a heat dissipating assembly comprising:

a first thermal plate attached on the circuit board, the first thermal plate comprising at least one offset portion thermally connecting the at least one electronic component for dissipating heat therefrom, the first thermal plate defining a first hole in a central portion thereof, and a plurality of second holes in corners thereof;

a second thermal plate cooperating with the first thermal plate to sandwich the circuit board therebetween, the second thermal plate defining a third hole corresponding to the first hole of the first thermal plate, and a plurality of fourth holes corresponding to the second holes of the first thermal plate;

an adjusting screw extending through the first hole and movably engaging in the third hole for facilitating thermal contact between the at least one electronic component and the at least one offset portion of the thermal plate; and a plurality of fastening screws extending through the second holes and engaging in the fourth holes thereby securing the thermal plates to the circuit board.

6. The combination as claimed in claim 5, wherein the adjusting screw of the heat dissipating assembly is made of highly heat conductive material.

7. The combination as claimed in claim 5, wherein the at least one offset portion of the heat dissipating assembly is upwardly punched.

8. A heat dissipating assembly comprising:

a printed circuit board with a heat generating device thereon, said printed circuit board defining opposite first and second surfaces thereon;

a first thermal plate disposed on the first surface and defining an offset portion in compliance with a contour of said heat-generating device to compliantly receive the heat-generating device therein;

a plurality of fastening devices positioned on peripheries of the printed circuit board and the first thermal plate to fasten the printed circuit board and the first thermal plate together; and an adjustment device located around inner portions of said printed circuit board and said first thermal plate to adjustably have the offset portion and the heat-generating device abut against each other.

9. The assembly claimed in claim 8, wherein a second thermal plate is disposed on the second surface of the printed circuit board.

10. The assembly claimed in claim 9, wherein thermal conduction occurs between the first thermal plate and said second thermal plate.

11. The assembly claimed in claim 10, wherein thermal conduction occurs around said adjustment device.

12. The assembly claimed in claim 8, wherein the offset portion and the heat-generating device abut against each other in a direction perpendicular to the first surface.

* * * * *